United States Patent
Bozman et al.

(10) Patent No.: US 8,499,273 B1
(45) Date of Patent: Jul. 30, 2013

(54) SYSTEMS AND METHODS FOR OPTIMIZING PLACEMENT AND ROUTING

(75) Inventors: Kimberley Anne Bozman, Delta (CA); Ryan Fung, Missisauga (CA); Vaughn Betz, Toronto (CA); David Neto, Toronto (CA); Ketan Padalia, Thornhill (CA)

(73) Assignee: Altera Corporation, San Jose, CA (US)

( * ) Notice: Subject to any disclaimer, the term of this patent is extended or adjusted under 35 U.S.C. 154(b) by 205 days.

(21) Appl. No.: 12/955,521

(22) Filed: Nov. 29, 2010

Related U.S. Application Data

(60) Provisional application No. 61/265,284, filed on Nov. 30, 2009.

(51) Int. Cl.
*G06F 17/50* (2006.01)

(52) U.S. Cl.
USPC ............................. 716/132; 716/119; 716/126

(58) Field of Classification Search
USPC ............................................. 716/119, 126, 132
See application file for complete search history.

(56) References Cited

U.S. PATENT DOCUMENTS 7,902,888 B1 * 3/2011 Mei et al. ..................... 327/157

* cited by examiner

*Primary Examiner* — Thuan Do
(74) *Attorney, Agent, or Firm* — Weaver Austin Villeneuve & Sampson LLP

(57) ABSTRACT

Systems and techniques are described for optimizing placement and routing by providing global information during early stages of a computer aided design (CAD) flow to produce better place and route solutions. Moreover, the systems and techniques described herein use natural connectivity information inherently provided in a design hierarchy.

21 Claims, 16 Drawing Sheets

SYSTEMS AND METHODS FOR OPTIMIZING PLACEMENT AND ROUTING

CROSS-REFERENCE TO RELATED APPLICATIONS

This application claims the benefit, under 35 U.S.C. §119 (e), of U.S. provisional application No. 61/265,284, filed on Nov. 30, 2009, titled "SYSTEMS AND METHODS FOR USING DESIGN HIERARCHIES FOR IMPROVING EFFICIENCY IN A DESIGN FLOW", which is hereby incorporated by reference in its entirety.

FIELD OF THE INVENTION

The present disclosure generally relates to integrated circuits and other devices of that general type. More particularly, the present disclosure relates to systems and methods for optimizing placement and routing during a computer-aided design (CAD) flow.

BACKGROUND

A computer aided design (CAD) flow includes a synthesis stage, a partition or clustering stage, and a place and route stage. During the synthesis stage, a register transfer layer (RTL) description is converted into an unoptimized flattened netlist of basic gates. Moreover, logic optimization is performed on the flattened netlist to simplify and remove duplicate logic. The optimized netlist is then mapped to a specific target technology using a library of basic building blocks.

An output of the synthesis stage is a flattened netlist of basic building blocks such as logic gates and registers specific to a target technology. The flattened netlist can be upwards of millions of elements. Providing such large flattened netlists directly into the placement and route stage reduces the probability that the placement and route stage will be able to find a good solution for routability and timing or, at the very least, it would take an exceedingly long time to do so.

Typically the clustering or partitioning stage is performed prior to the placement stage to coarsen the flattened netlist in order to make the flattened netlist more manageable for placement to produce better quality solutions in less time.

There exist techniques which attempt to provide quick global information during these early stages in the CAD flow. For example, some of these techniques include using high-level partitioning or performing quick placements prior to the clustering stage.

However, these stages perform local optimizations with no insight on how these optimizations affect a final design implementation of an integrated circuit. The synthesis and partitioning or clustering stages may make modifications to the flattened netlist based on what looks like good local information but which ultimately makes the placement and routing solution worse.

A problem with some of the existing techniques is that they themselves operate on the entire flattened netlist and thus dramatically increase compilation time. Also, because some of these existing techniques are meant to run quickly, they often get caught in a local minima.

SUMMARY OF THE INVENTION

Systems and techniques described herein for optimizing placement and routing provide global information during early stages of a computer aided design (CAD) flow help solve the problems discussed above to produce better place and route solutions. Moreover, the systems and techniques described herein use natural connectivity information inherently provided in a user created design hierarchy.

The systems and techniques, described herein, solve the problems by introducing the following first, second, and/or third techniques. The first technique includes creating a hierarchy tree, maintaining the hierarchy tree, using properties of a hierarchy node, such as a size of the hierarchy node and/or a position of the hierarchy node in the hierarchy tree, to perform simplifications to the hierarchy tree to enable the operations described in the second technique. The second technique includes using netlist connectivity and timing information to determine relationships between hierarchy nodes. For example, hierarchy nodes that are not related are not clustered with each other or partitioned from each other. As another example, exclusion is applied between weakly connected hierarchy nodes. The third technique includes keeping a history of clustering or partitioning hierarchy nodes and using the history.

BRIEF DESCRIPTION OF THE DRAWINGS

The systems and techniques may best be understood by reference to the following description taken in conjunction with the accompanying drawings, which illustrate specific embodiments of the present invention.

DETAILED DESCRIPTION

Figure 1:
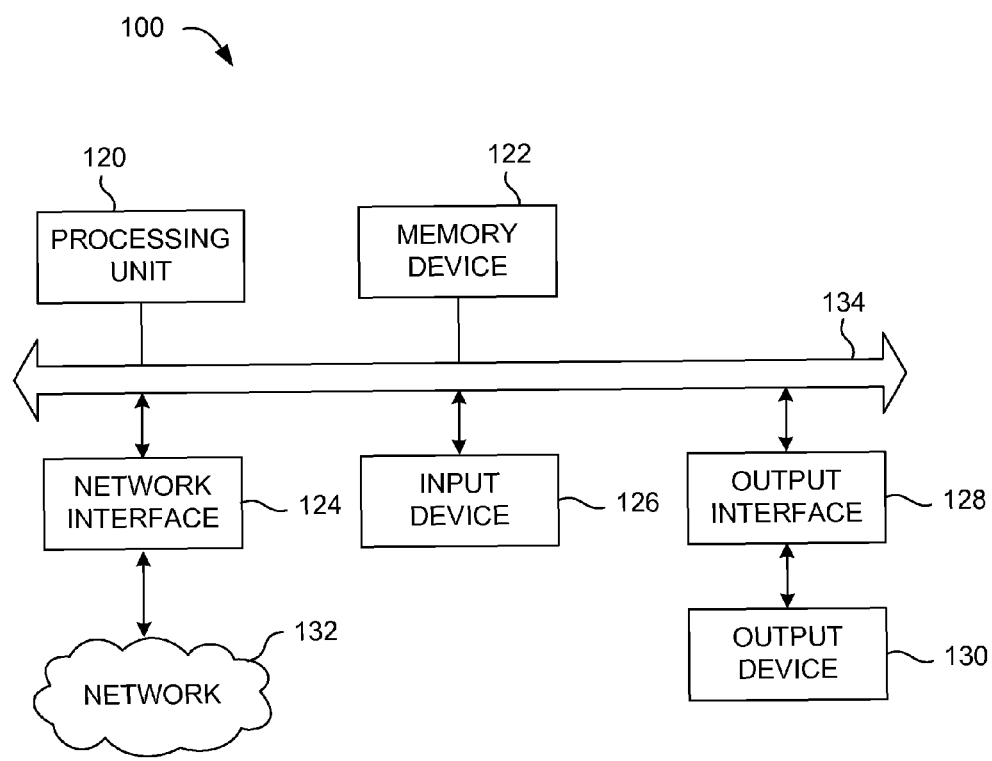
FIG. 1 is a block diagram of an embodiment of a system for optimizing placement and routing.

FIG. 1 is a block diagram of an embodiment of a system 100 for optimizing placement and routing. System 100 includes a processing unit 120, a memory device 122, a network interface 124, an input device 126, an output interface 128, and an output device 130. Processing unit 120 may be a central processing unit (CPU), a microprocessor, a floating point coprocessor, a graphics coprocessor, a hardware controller, a microcontroller, a programmable logic device programmed for use as a controller, a network controller, or other processing unit. Memory device 122 may be a random access memory (RAM), a read-only memory (ROM), or a combination of RAM and ROM. For example, memory device 122 includes a computer-readable medium, such as a floppy disk, a ZIP™ disk, a magnetic disk, a hard disk, a compact disc-ROM (CD-ROM), a recordable CD, a digital video disc (DVD), or a flash memory. It is noted that the computer-readable medium is non-transitory. For example, the computer-readable medium is not a signal. Memory device 122 stores the techniques, described herein, for optimizing placement and routing.

Network interface 124 may be a modem or a network interface card (NIC) that allows processing unit 120 to communicate with a network 132, such as a wide area network (WAN) or a local area network (LAN). Processing unit 120 may be connected via a wireless connection or a wired connection to network 132. Examples of the wireless connection include a connection using Wi-Fi protocol or a WiMax protocol. The Wi-Fi protocol may be an IEEE 802.11, IEEE 802.11a, IEEE 802.11b, IEEE 802.11g, or IEEE 802.11i protocol. Examples of input device 126 include a mouse, a keyboard, a stylus, or a keypad. Output device 130 may be a liquid crystal display (LCD) device, a plasma display device, a light emitting diode (LED) display device, or a cathode ray tube (CRT) display device. Examples of output interface 128 include a video controller that drives output device 130 to display one or more images based on instructions received from processing unit 120. Processing unit 120 access the techniques, described herein, for optimizing placement and routing, from memory device 122 or from a remote memory device, similar to memory device 122, via network 132, and executes the techniques. Processing unit 120, memory device 122, network interface 124, input device 126, output interface 128, and output device 130 communicate with each other via a bus 134. In another embodiment, system 100 may not include input device 126 and/or network interface 124.

Figure 2:
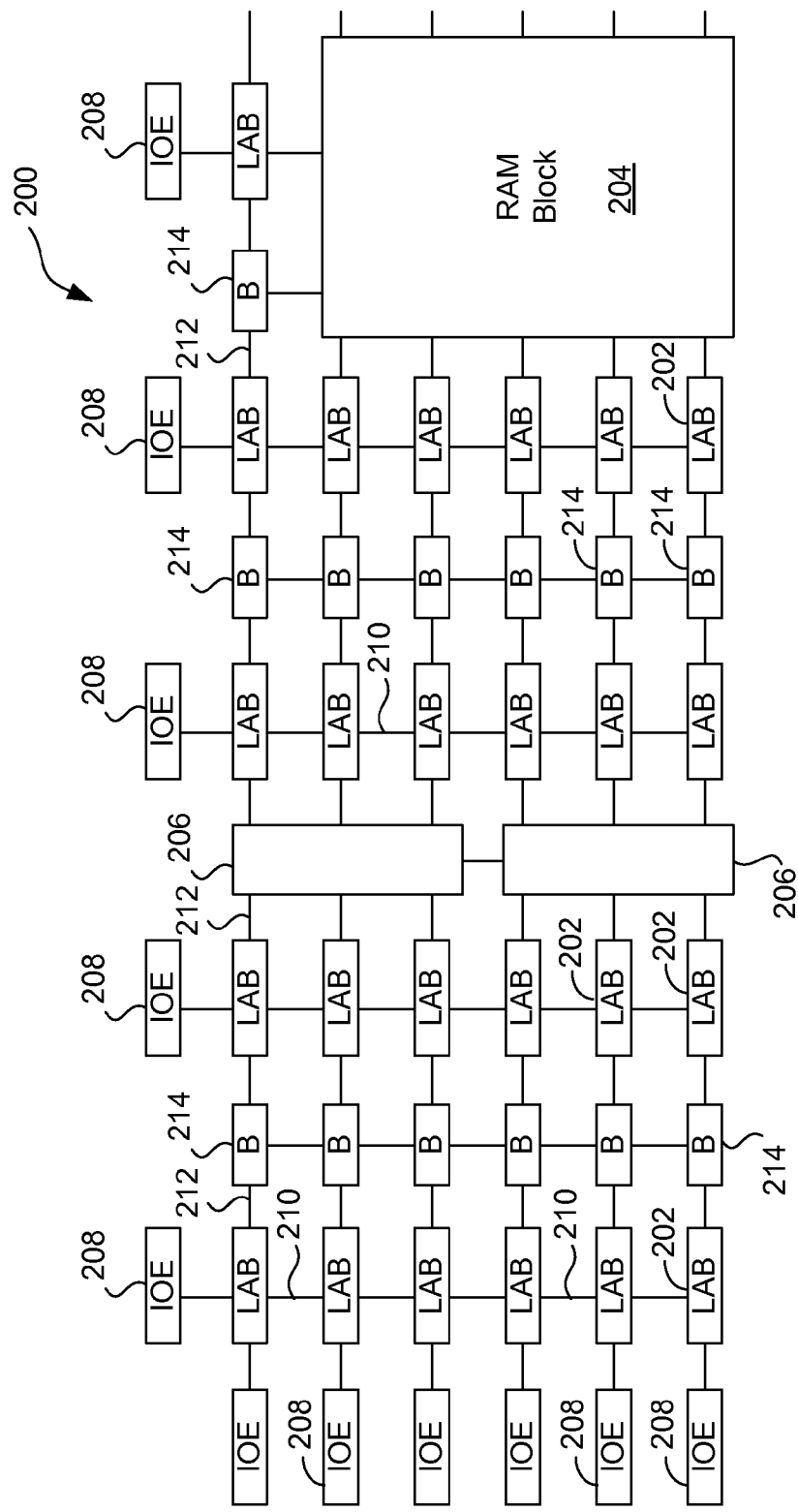
FIG. 2 is a block diagram of an embodiment of a programmable logic device (PLD) that is configured by using the system of FIG. 1.
Figure 3:
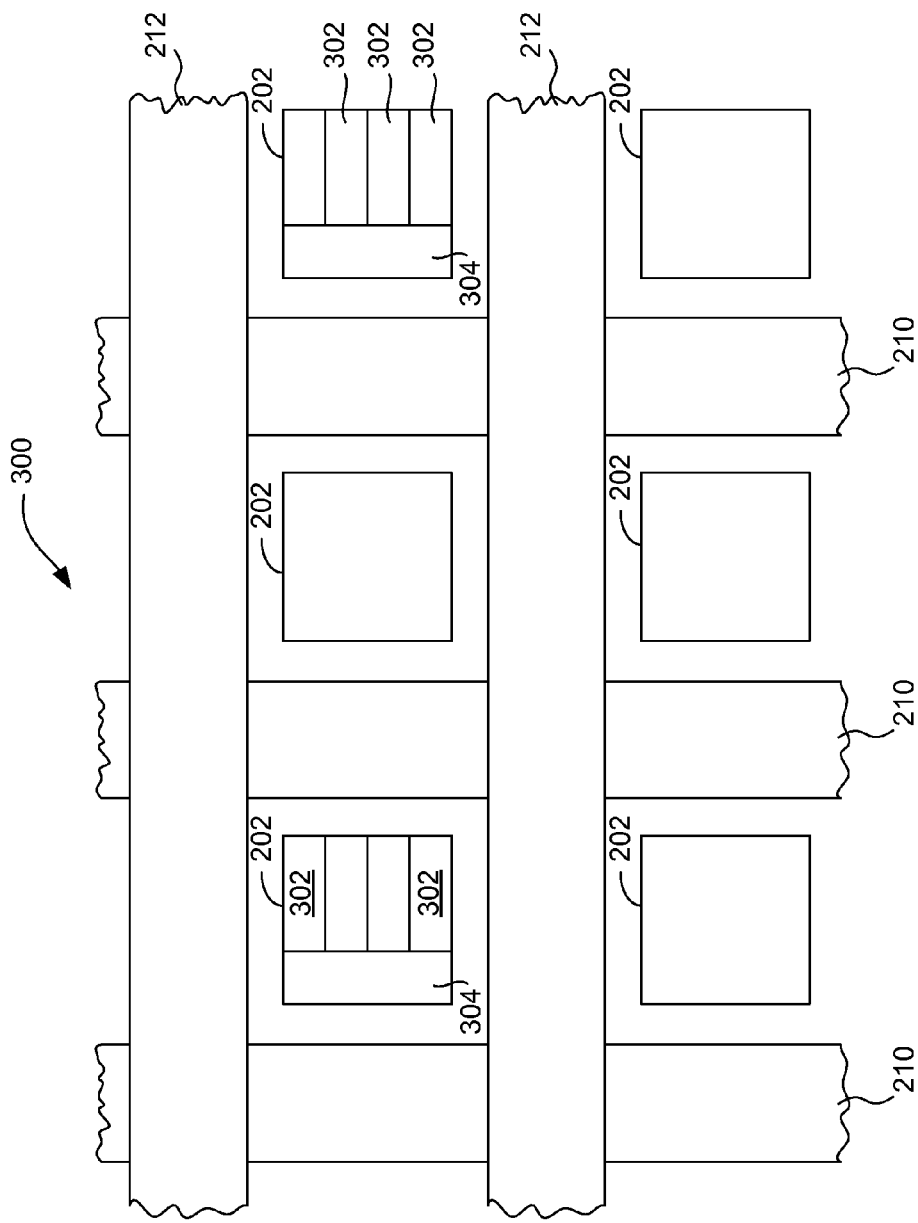
FIG. 3 is a block diagram of an embodiment of a portion of the PLD.

FIG. 2 is a block diagram of an embodiment of a programmable logic device (PLD) 200 that is configured by using system 100 of FIG. 1, and FIG. 3 is a block diagram of an embodiment of a portion 300 of PLD 200. PLD 200 includes a two-dimensional array of programmable logic array blocks (LABs) 202 that are interconnected by a network of a plurality of column interconnects 210 and a plurality of row interconnects 212 of varying length and speed. For the purpose of avoiding clutter in FIG. 2, not all LABs are numbered 202. LABs 202 include multiple logic elements (LEs) 302 (shown in FIG. 3). Each LE 302 may be a logic gate, such as an AND gate, an OR gate, an XOR gate, or a NOR gate. PLD 200 also includes a distributed memory structure including a plurality of RAM blocks of varying sizes provided throughout the array. The RAM blocks include, for example, a RAM block 204. PLD 200 further includes a plurality of digital signal processing (DSP) blocks 206 that can implement, for example, multipliers, add features, and/or subtract features. A plurality of input/output (I/O) elements (IOEs) 208 located around the periphery of PLD 200 support numerous single-ended and differential I/O standards. PLD 200 further includes a plurality of buffers (Bs) 214 that connect LABs 202. Buffers 214 may be used to store data that is transferred between LABs 202.

Referring to FIG. 3, PLD 200 includes a plurality of sets 304 of multiple lines and LABs 202. LEs 302 of LAB 202 are connected with each other via set 304 of lines.

Figure 4:
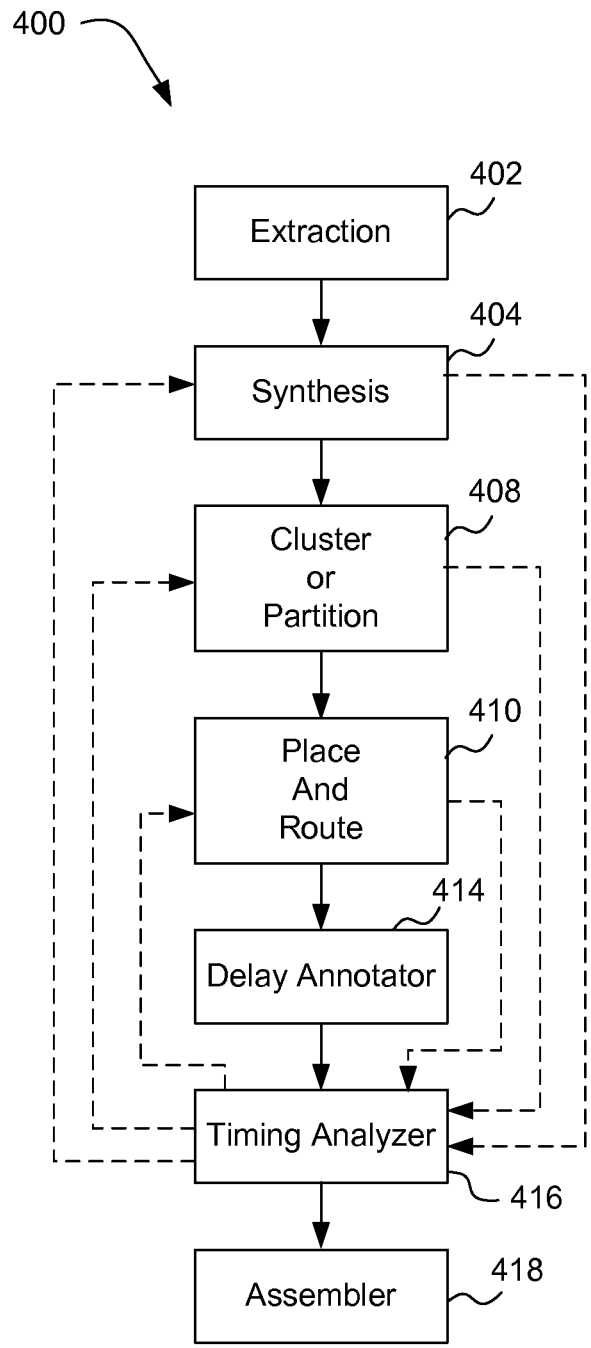
FIG. 4 is a block diagram of an embodiment of a technique for designing and implementing an integrated circuit, such as the PLD or an Application Specific Integrated Circuit (ASIC).

FIG. 4 is a block diagram of an embodiment of a technique 400 for designing and implementing an integrated circuit, such as PLD 200 or an Application Specific Integrated Circuit (ASIC). Technique 400 is a very large scale integrated circuit (VLSI) computer-aided design (CAD) flow. Technique 400 is a compilation process that includes an input and extract phase 402, a synthesis phase 404, a cluster or partition phase 408, a place and route phase 410, a delay annotator phase 414, a timing analysis phase 416, and an assembler phase 418. Processing unit 120 accesses technique 400 stored within memory device 122 (FIG. 1) or the remote memory device, and executes the technique.

Processing unit 120 executes technique 400 to convert a user design expressed, for example, as a Hardware Description Language (HDL) by a user, into a programmable device configuration to configure PLD 200 to implement the user design. Processing unit 120 executes input phase 402 to receive the user design. During input phase 402, processing unit 120 receives multiple functional components to be implemented on an integrated circuit. For example, processing unit 120 may receive a controller or a computer as functional components. A functional component is an example of LE 302 (FIG. 3). As another example, processing unit 120 receives a spreadsheet or an electronic document describing functions of multiple functional components. During extract phase 402, processing unit converts the functions into an HDL code, such as Verilog or Very High Speed Integrated Circuit HDL (VHDL) code. HDL code describes hierarchy and functionality of LEs 302 and includes implications on connectivity between the LEs 302.

Processing unit 120 executes synthesis phase 404 to convert the HDL code of the user design into multiple sets of logic gates. Each set of logic gates is located within an atom and each set includes zero or more logic gates. Each atom includes a set of logic gates. Processing unit 120 further executes cluster or partition phase 408 to group related atoms together into clusters or partitions. Processing unit 120 also executes place phase 410 to assign clusters of atoms to multiple blocks on PLD 200. For example, processing unit 120 uses determinations made during cluster or partition phase 408 as a hint, as a hard constraint, or to initially group LEs 302 into LAB 202. Processing unit 120 executes route phase 410 to determine a configuration of a configurable switching circuit of PLD 200 used to connect the blocks implementing the user design.

Processing unit 120 executes delay annotator phase 414 to determine multiple signal delays, such as data delays, for the set of atoms and their associated connections in the configurable switching circuit by using a timing model of PLD 200. Processing unit 120 executes timing analysis phase 416 to determine whether the implementation of the user design in PLD 200 will meet a multiple long-path and short-path timing constraints specified by the user via input device 126. It is noted that timing analysis phase 416 may be performed directly after performing synthesis phase 404, cluster or partition phase 408, or place and route phase 410. Information, such as timing delays, generated during the timing analysis phase 416 may be used during the synthesis phase 404, cluster or partition phase 408, or place and route phase 410.

Processing unit 120 executes assembler phase 418 to generate configuration information specifying the configuration of PLD 200 implementing the user design, including the configuration of each LE 302 used to implement the user design and the configuration of the configurable switching circuit used to connect the LEs 302. Processing unit 120 executes assembler phase 418 to write the configuration information to a configuration file, which can be stored within memory device 122 and can then be used to configure PLD 200 to implement instances of the user design.

In an alternative embodiment, processing unit 120 receives a description of functionality of the functional components in the form of HDL code.

Figure 5:
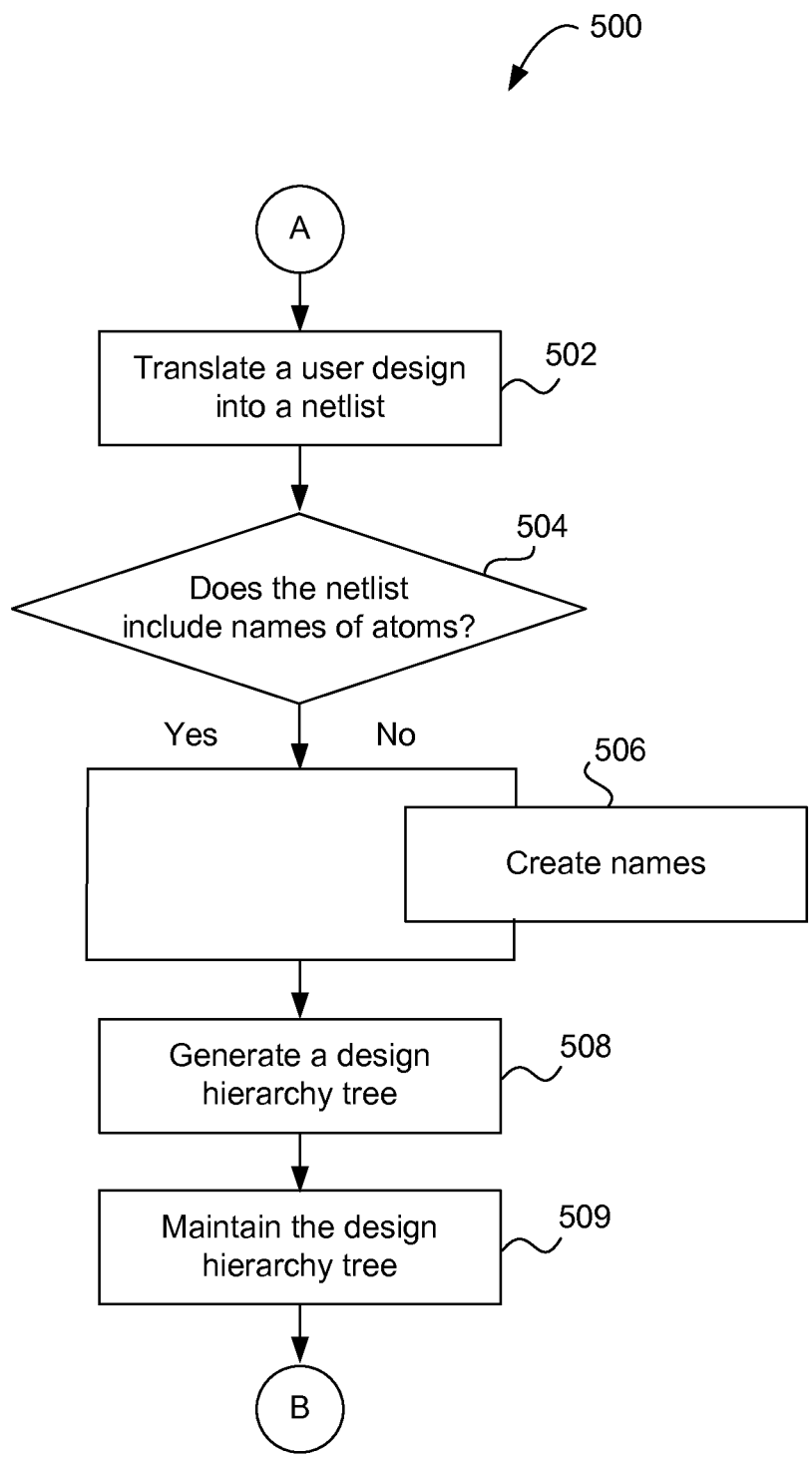
FIG. 5 is a flowchart of an embodiment of a technique for optimizing placement and routing.

FIG. 5 is a flowchart of an embodiment of a technique 500 for optimizing placement and routing. Processing unit 120 translates 502 the user design, which may be an HDL code, into a netlist of one or more atoms. Processing unit 120 determines 504 whether a netlist includes names of atoms. A netlist may include names of atoms and the names may be generated during the translation 502. For example, a netlist includes a name, such as, "A:B:B1:B11", where A is "my_computer", B is "mu-cpu", B1 is "my_counter", and B11 is "reg4" that includes an atom. As another example, the name is "A:B:B1", where A is "my_cpu", B is "my_alu", B1 is "my_adder", and the adder includes an atom. As yet another example, a netlist includes a name "A:B" of another set of logic gates.

A name of a set of logic gates indicates a location of the set in a design hierarchy of the user design. For example, the name "A:B:B1:B11" suggest that B11 is located within a design hierarchy including a top level entity A, which contains an entity B, which further contains an entity B1, which further contains an entity B11 including a set of logic gates.

Upon determining that the translation 502 does not create names of set of logic gates, processing unit 120 creates 506 names of atoms within entities of the user design and stores the names within memory device 122. For example, processing unit 120 determines a name of an atom of a memory bus within an I/O device of a computer to be "my_computer: my_io:my_memorybus". As another example, processing unit 120 determines a name of an atom of a register 0 of a memory of a computer to be "my_computer:my_memory: my_register0".

Figure 6:
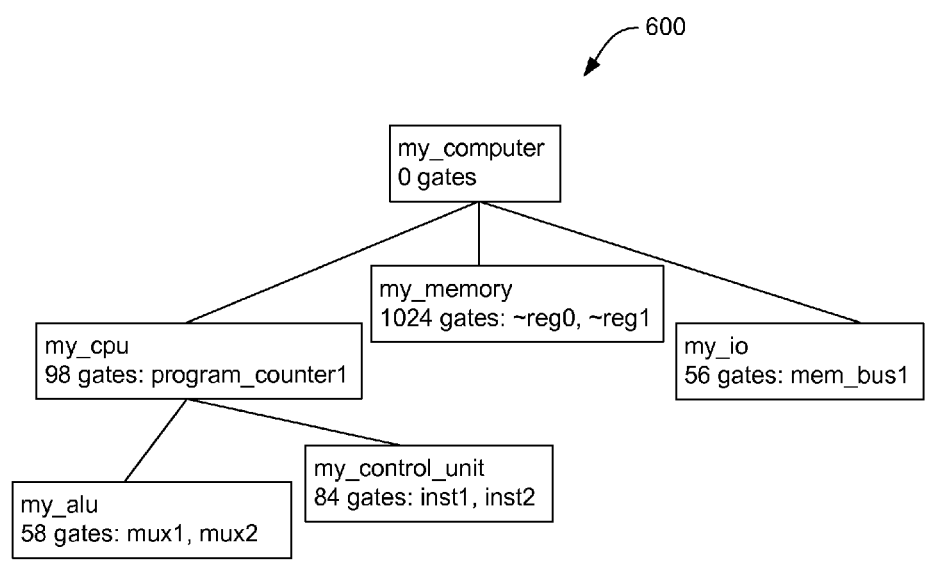
FIG. 6 shows an embodiment of a design hierarchy tree used to illustrate the technique of FIG. 5.
Figure 7:
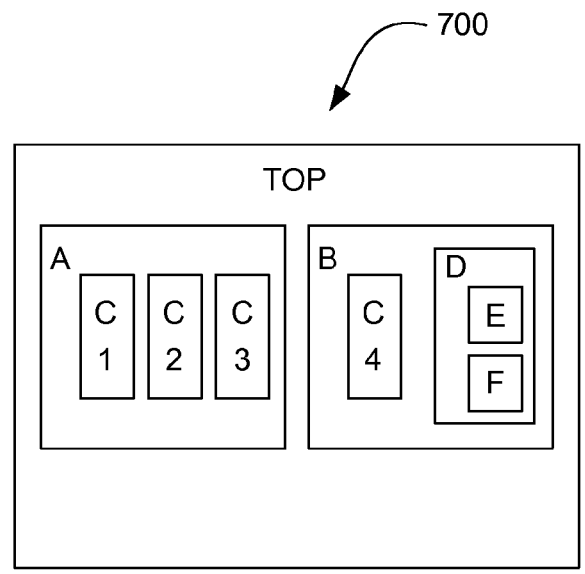
FIG. 7 shows another embodiment of a design hierarchy tree used to illustrate the technique of FIG. 5.
Figure 8:
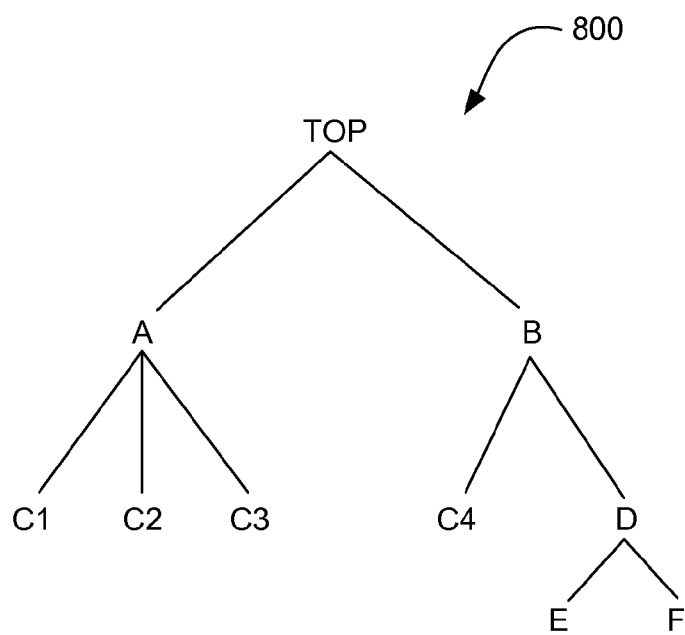
FIG. 8 shows yet another embodiment of the design hierarchy tree of FIG. 7.

Processing unit 120 generates 508 a design hierarchy tree of the user design based on names of sets of logic gates. Each atom is represented as a node of a design hierarchy tree. Each node of a design hierarchy tree includes a set of logic gates that reside at the node such that every logic gate in a netlist resides somewhere in the design hierarchy tree. A size of a node is a number of logic gates at the node. It may be possible for a node to include zero logic gates. For example, node "my_computer" that is a top-level entity or a wrapper that joins together other nodes of a design hierarchy tree does not include a logic gate. An exemplary design hierarchy tree 600 is illustrated in FIG. 6. Another exemplary design hierarchy tree 700 is illustrated in FIG. 7. Yet another exemplary hierarchy tree 800 is illustrated in FIG. 8. Each hierarchy tree 700 and 800 includes multiple nodes including 'Top', A, B, C1, C2, C3, C4, D, E, and F. It is noted that each node C1, C2, C3, and C4 is a separate instance of the same node C. In various embodiments, design hierarchy tree 600, 700, or 800 includes any number of nodes.

A design hierarchy tree can be read, conceptualized, and maintained. In addition, a node of a design hierarchy tree can be re-used and allows multiple users to be working in parallel because each node of the design hierarchy tree can be independently written and tested. Each node in a design hierarchy tree is defined by inputs of the node and outputs of the node, and contains information describing logical behavior of the node. When a node is re-used by processing unit 120, a new instance of the node is created. For example, the new instance of a node may operate on different inputs and outputs of the node than inputs and outputs operated on by an old instance of the node. Each node of the same type has the same logical behavior but operates on different inputs and outputs. Also, a design hierarchy tree includes information about a global relationship and the information includes structure and flow of one or multiple instances of one or more nodes in the design hierarchy tree. An example of the structure includes a number of logic gates within a node and an example of flow includes whether a node is located within another node. Such information is lost if a netlist is flattened during a synthesis stage.

Processing unit 120 maintains 509 a design hierarchy tree generated at operation 508. As an example, processing unit 120 uses timing analysis phase 410 to determine whether duplicating a node of a design hierarchy tree improves a maximum frequency (Fmax) of an integrated circuit, such as PLD 200 or an ASIC. Upon determining that the duplication improves the maximum frequency, processing unit 120 duplicates the node. On the other hand, upon determining that the duplication does not improve the maximum frequency, processing unit 120 does not duplicate the node. As another example, processing unit 120 determines whether a design hierarchy tree includes small and/or empty nodes. Upon determining that the design hierarchy tree includes small and/or empty nodes, processing unit 120 merges the small and/or empty nodes into its parent node. On the other hand, upon determining that the design hierarchy tree does not include small and/or empty nodes, processing unit 120 does not merge the nodes into its parent node. A node that does not include a representation of a logic gate is an empty node and a node that includes less than a certain number of representations of logic gates is a small node. The user provides, via input device 126 (FIG. 1), to processing unit 120 the certain number of representations.

Figure 9:
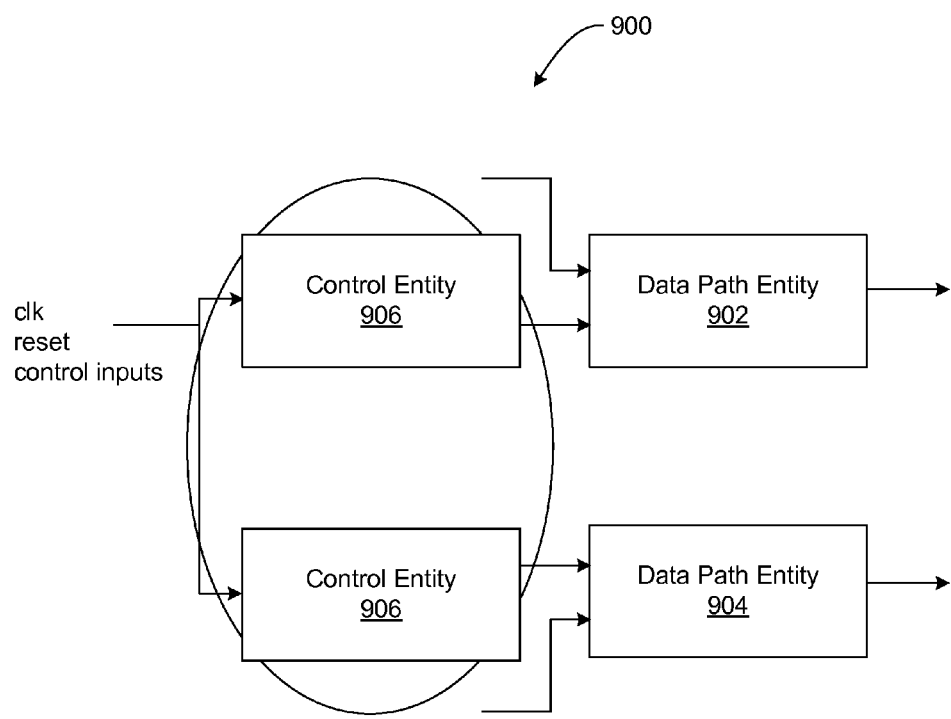
FIG. 9 is an example of a representation of a design hierarchy tree to which the technique may be applied.

It is noted that if translation 502, creation 506, and generation 508 are executed during a pre-synthesis phase between extract phase 402 (FIG. 4) and synthesis phase 404 (FIG. 4), a netlist, created during the pre-synthesis phase, used to perform the translation, creation, and generation is unoptimized. Processing unit 120 optimizes a netlist during synthesis stage 404. For example, FIG. 9 is a block diagram of an embodiment of a system 900 for optimizing a netlist. System 900 is a representation of a design hierarchy tree. System 900 includes multiple data path entities 902 and 904 connected to identical control entities 906. Each data path entity 902 and 904 includes data sub-entities, such as, a register, a multiplexer, an adder, and a counter. Control entity 906 may be a part of a finite state machine that receives a system clock signal (clk) for sequencing, a reset signal (reset) to initialize control entity 906, and multiple other input control signals from other entities (not shown). Control entity 906, data path entities 902 and 904, and the other entities are integrated within an integrated circuit. These other entities produce state information for data path entities 902 and 904. To optimize a netlist, during synthesis phase 404, processing unit 120 determines to merge control entities 906 to merge duplicate logic within each control entity 906 to reduce area utilized within an integrated circuit. As another example, processing unit 120 may optimize, during synthesis phase 404, control entities 906 by considering placement information of the control entities 906 to improve timing, such as the maximum frequency, of the integrated circuit.

Figure 10:
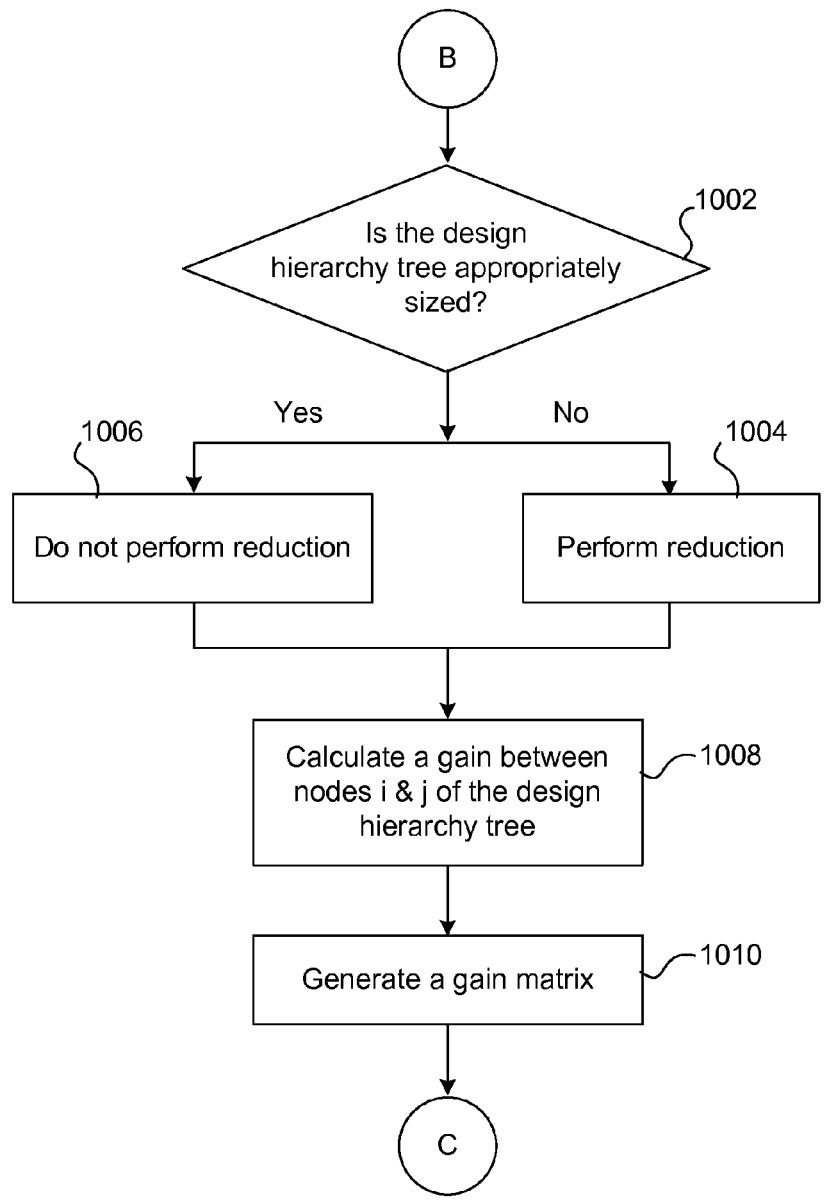
FIG. 10 is a continuation of the flowchart of FIG. 5.

FIG. 10 is a continuation of the flowchart of FIG. 5. Processing unit 120 determines 1002 whether a design hierarchy tree generated in 508 (FIG. 5) is appropriately sized. For example, processing unit 120 determines whether a design hierarchy tree generated in 508 (FIG. 5) is larger than a pre-specified amount. The pre-specified amount is provided, by the user, via input device 126 (FIG. 1) and represents a number of nodes on a design hierarchy tree. Upon determining that a design hierarchy tree is larger than the pre-specified amount, processing unit 120 performs reduction 1004 of the design hierarchy tree by pre-merging portions of the design hierarchy tree and upon determining that the design hierarchy tree is not larger than the pre-specified amount, processing unit 120 does not perform the reduction 1006. For example, processing unit 120 determines whether a parent node of a design hierarchy tree is linked with equal to or less than N child nodes and each child node has equal to or less than M number of logic gates, where M and N are constants provided by the user via input device 126. In this example, processing unit 120 pre-merges one or more child nodes into its parent node upon determining that the parent node is linked with equal to or less than N child nodes and each of the child nodes has equal to or less than M logic gates. In this example, processing unit 120 does not pre-merge one or more child nodes into its parent node upon determining that the parent node is linked with greater than N child nodes and each of the child nodes has greater than M logic gates. As another example, processing unit 120 determines whether the parent node of a design hierarchy tree is linked with less than or equal to N child nodes and/or whether each child node of the parent node has less than M logic gates to determine whether to merge the child nodes into the parent node. As still another example, M is a fraction of the total number of atoms of a design hierarchy tree.

As yet another example, processing unit 120 merges a certain number of child nodes into a parent node of a design hierarchy tree. In this example, processing unit 120 starts from a first child node of the design hierarchy tree and merges the first child node into its first parent node. Upon determining that the certain number is reached after merging the first child node into the first parent node, processing unit 120 determines to cease any further merging including merging a second child node into the first parent node. On the other hand, upon determining that the certain number is not reached, processing unit 120 merges the second child node into the first parent node and determines whether the certain number is reached. Processing unit 120 continues merging until the certain number is reached and stops merging after the certain number is reached. The certain number is provided by the user via input device 126.

As still another example, processing unit 120 merges a child node into its parent node until a give number of logic gates is reached within the parent node. The given number is provided by the user via input device 126. In this example, processing unit 120 merges a child node with its parent node to generate a first merged child node and counts a number of logic gates within the first merged child node. Upon determining that the number of logic gates within the first merged child node is less than or equal to the given number, processing unit 120 continues to merge the first merged child node with its parent node. Moreover, in this example, upon determining that the number of logic gates of the first merged child node is greater than the given number, processing unit 120 does not merge the first merged child node with its parent node. As another example, processing unit 120 merges two nodes, of a design hierarchy tree, that are indicated by the user via input device 120 as being placed close to each other. On the other hand, in this example, processing unit 120 does not merge two nodes of the design hierarchy tree that are indicated by the user via input device 126 as not being placed close to each other.

It is noted that there is only one link between a parent node and a child node. Accordingly, a parent node and a child node are directly connected. Although a design hierarchy tree has good hierarchy and a reasonable number of nodes, processing unit 120 performs pre-merging 1004 to ensure a cap on the total number of nodes of the design hierarchy tree.

In an alternative embodiment, processing unit does not perform pre-merging 1004.

Processing unit 120 calculates 1008 a gain for nodes from a standpoint of each of the nodes. For example, processing unit 120 calculates a gain between two nodes i and j from standpoints of nodes i and j as:

$$\text{gain}\{i, j\} = \sum_{all\_nets(i,j)} \text{fanout\_size\_of\_net}(i, j)^\alpha \qquad (1)$$

where $\alpha$ is a constant provided by the user via input device 126. The constant $\alpha$ can be tuned, based on experimentation, to find an optimal value of a given application of an integrated circuit. Examples of the application include use of an integrated circuit within a cell phone, use of an integrated circuit within a router, and use of an integrated circuit within a digital camera.

Figure 11:
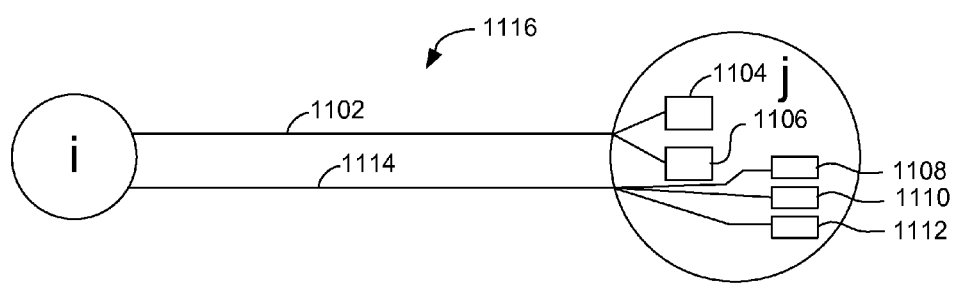
FIG. 11 is an embodiment of a system used to illustrate use of fanout size from a first standpoint in the technique.
Figure 12:
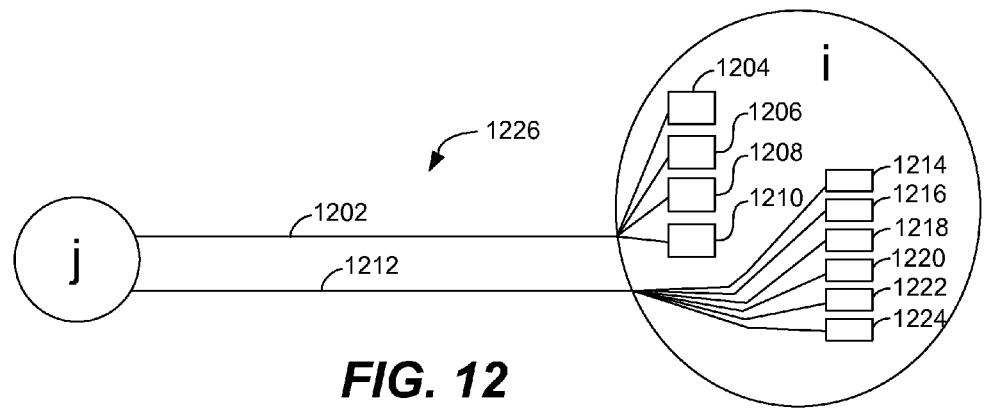
FIG. 12 is an embodiment of a system used to illustrate use of fanout size from a second standpoint in the technique.

A fanout size of a net between nodes i and j from the standpoint of node i is equal to a number of logic gates within node j to which the net is connected. For example, as shown in FIG. 11, the node i is connected via a net 1102 to two logic gates 1104 and 1106 within node j and accordingly net 1102 has a fanout size of two. As another example, node i is connected to three logic gates 1108, 1110, and 1112 of the node j via a net 1114, and accordingly net 1114 has a fanout size of three. Similarly, a fanout size of a net between nodes j and i from the standpoint of node j is equal to a number of logic gates within node i to which the net is connected. For example, as shown in FIG. 12, node j is connected via a net 1202 to four logic gates 1204, 1206, 1208, and 1210 within node i and a net 1212 to six logic gates 1214, 1216, 1218, 1220, 1222, and 1224 within node i, and accordingly net 1202 has a fanout size of four and net 1212 has a fanout size of six. It is noted that although a specific number of fanout sizes are illustrated in FIGS. 11 and 12, any other integer number of fanout size can be used instead. Moreover, it is noted that although a specific number of nets is shown between nodes i and j in FIGS. 11 and 12, a different number of nets may exist between nodes i and j. Additionally, it is noted that a link between nodes i and j includes any number of nets between the two nodes. For example, nets 1102 and 1114 are nets of a link 1116 connecting node i to node j. As another example, nets 1202 and 1212 are nets of a link 1226 connecting node j to node i. A link between two nodes i and j does not exist if there are no nets connecting the two nodes. A link is a connection.

Processing unit 120 applies the mathematical statement (1) to sum fanout sizes over all nets between i and j from the standpoints of nodes i and j. For example, processing unit 120 sums the fanout sizes of two and three illustrated in FIG. 11 to calculate five, which is an exemplary first sum of all fanout sizes between nodes i and j from the standpoint of node i. Moreover, in this example, processing unit 120 further sums fanout sizes over all nets between nodes j and i from the standpoint of node j. For example, processing unit 120 sums the fanout sizes four and six illustrated in FIG. 12 to calculate ten, which is an exemplary second sum of all fanout sizes between nodes j and i from the standpoint of node j. Processing unit 120 calculates the gain $\{i, j\}$ in the mathematical operation (1) as a third sum having the power of $\alpha$, and the third sum is a total of the first and second sums.

It is noted that there is no need for a constant multiplier to be multiplied with any of the sums within the mathematical operation (1) because all gains are comparative. Moreover, the constant $\alpha$ allows to provide a weight to the gains calculated using the mathematical operation (1). For example, if upon determining that any of the sums calculated using mathematical operation (1) is a large number provided by the user via input device 126, processing unit 120 determines whether the large number represents signals that are global or local. In this example, the two nodes i and j may share, such as receive, a number of multiple control signals, such as clock signals, asynchronous clock signals, reset signals, or synchronous clock signals. The multiple control signals are examples of global signals. Moreover, in this example, the two nodes i and j may share a number of data signals, which are examples of local signals.

In another embodiment, processing unit 120 determines the gain $\{i, j\}$ to be proportional to the size of the node i and/or node j. For example, if a first node i includes a first number of logic gates that is greater than a second number of logic gates within a second node i, processing unit 120 determines a first gain {first node i, j} to be greater than a second gain {second node i, j}.

In various embodiments, processing unit 120 adds a weighted term to the mathematical statement (1) to consider other factors in the design hierarchy tree. Examples of the other factors include reducing a time delay on one or more critical links of a design hierarchy tree. Each critical link includes one or more nets and the critical links are identified by processing unit 120 or by the user via input device 126.

Processing unit 120 generates 1010 a gain matrix upon calculating 1008 gains from the standpoint of all nodes of a design hierarchy tree. For example, processing unit 120 generates the gain matrix upon calculating 1008 gains in a single pass or multipass over the netlist. An exemplary gain matrix is shown below as Table I.

TABLE I

|   | A   | B   | C    | D    |
|---|-----|-----|------|------|
| A | 0.4 | 2.9 | 0    | 1.2  |
| B | 2.9 | 6.3 | 0    | 0    |
| C | 0   | 0   | 64.5 | 84.9 |
| D | 1.2 | 0   | 84.9 | 51.2 |

The gain matrix includes multiple gains from the standpoint of all nodes of a design hierarchy tree. For example, the gain matrix of Table I includes multiple gains from the standpoint of nodes A, B, C, and D. In this example, the multiple gains include a gain between nodes A and B, a gain between nodes B and C, a gain between nodes C and D, and a gain between nodes A and D. The gain matrix is an M×M matrix for M nodes of a design hierarchy tree, where M is an integer.

Figure 13:
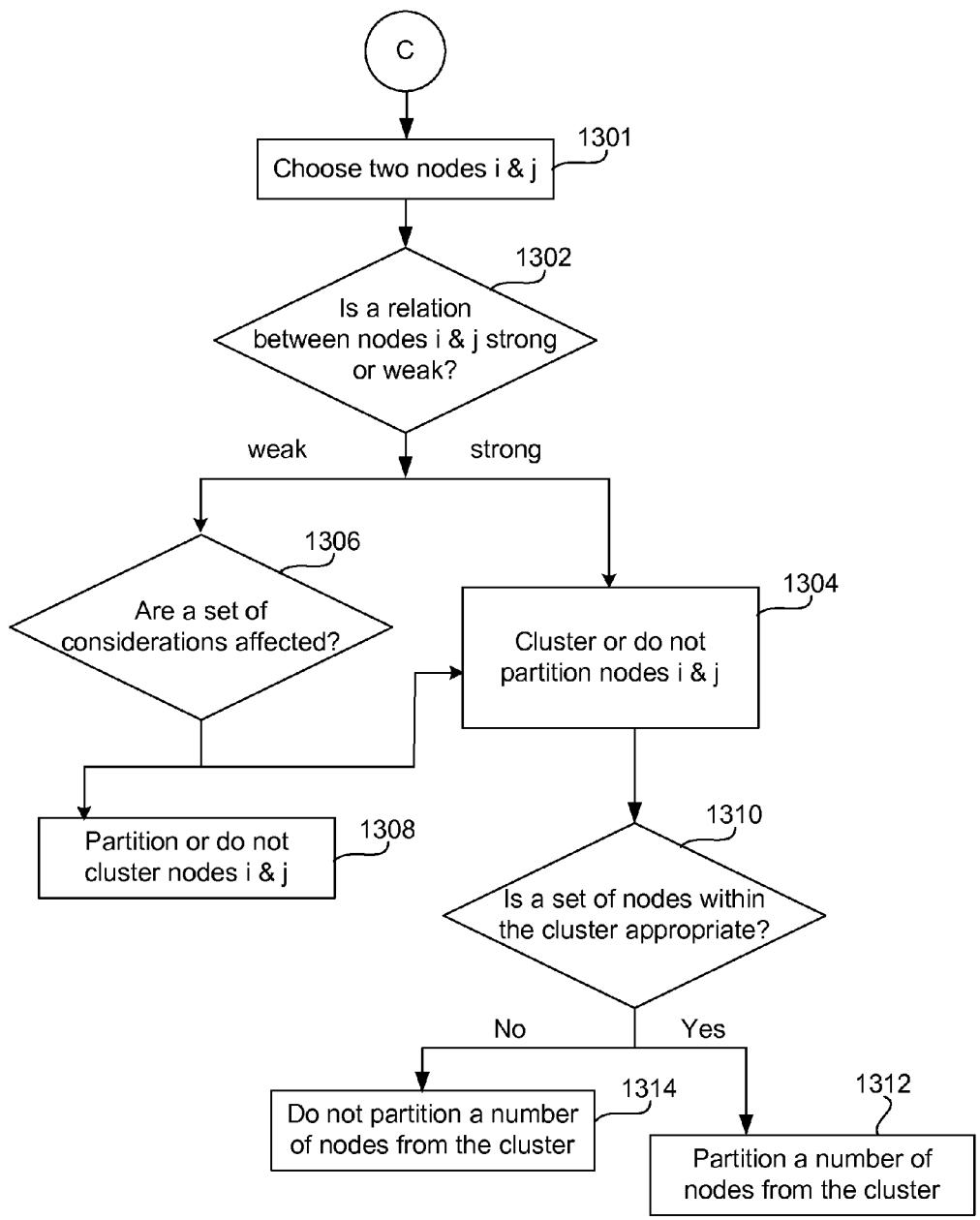
FIG. 13 is a continuation of the flowchart of FIG. 10.
Figure 14:
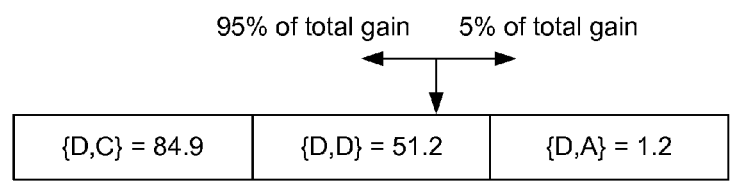
FIG. 14 is an embodiment of a chart illustrating use of a performance threshold in the technique.

FIG. 13 is a continuation of the flowchart of FIG. 10. Processing unit 120 chooses 1301 two nodes i and j and determines 1302, based on the gain matrix generated in 1010 (FIG. 10), whether there is a strong or weak relation between the two nodes i and j. For example, upon determining that a gain between nodes i and j from the standpoint of node i and from the standpoint of node j is greater than a percentage threshold $\beta$, such as 95% or 90%, of a total gain of the gain matrix relative to the node i, processing unit 120 determines that the nodes i and j are strongly related. In this example, the total gain of the gain matrix relative to the node i is a sum of all gains between the node i and the remaining nodes of the gain matrix. To illustrate, in this example, the total gain of the gain matrix relative to the node A is a sum of a first gain, such as 0.4, between nodes A and A, a second gain, such as 2.9, between nodes A and B, a third gain, such as 0, between nodes A and C, and a fourth gain, such as 1.2, between nodes A and D. To further illustrate, in this example, the total gain of the gain matrix relative to the node B is a sum of a fifth gain, such as 2.9, between nodes B and A, a sixth gain, such as 6.3, between nodes B and B, a seventh gain, such as 0, between nodes B and C, and an eighth gain, such as 0, between nodes B and D. Moreover, in this example, upon determining that a gain between nodes i and j from the standpoint of node i and a gain between nodes j and i from the standpoint of node j are less than or equal to the percentage threshold $\beta$, processing unit 120 determines that the nodes i and j are weakly related, such as unrelated. As an example, if the percentage threshold $\beta$ is equal to 95%, as evident from the gain matrix of Table I, node A is weakly related to node B from the standpoint of both nodes A and B, node C is strongly related to node D from the standpoint of nodes C and D, node A is weakly related to node D from the standpoint of both nodes A and D although node A shares a link with node D, node A is unrelated to node C form the standpoint of both nodes A and C in that no nets connect node A with node C, and node B is unrelated to node C from the standpoint of both nodes B and C in that no nets connect node B with node C. A node is unrelated to another node if a net does not exist between the two nodes and otherwise, the two nodes are related. An example of using the performance threshold $\beta$ is shown in FIG. 14.

It is evident from the gain matrix of Table I that there is a link between nodes A and B because a gain from the standpoint of either node A or node B is greater than a specified number, such as one or 0.5, provided by the user via input device 126. Similarly, it is evident from the gain matrix of Table I that there is a strong relation between nodes C and D and that nodes A and D share a link.

One reason for existence of a strong relation between nodes i and j from the standpoint of node i and a weak relation between nodes j and i from the standpoint of node j is that node i has a small number of logic gates and node j has a large number of logic gates.

In various other embodiments, the percentage threshold $\beta$ may be a constant provided by the user via input device 126 or processing unit 120 adjusts the percentage threshold based on an application, such as use within a cell phone or a computer, of an integrated circuit, such as PLD 200 or ASIC.

Referring back to FIG. 13, processing unit 120 clusters or does not partition 1304 nodes i and j that are strongly related. Partitioning of nodes i and j is performed if the nodes i and j are clustered and clustering of the nodes i and j is performed if the nodes i and j are partitioned.

Processing unit 120 determines 1306 whether a set of considerations are affected by partitioning or not clustering the nodes i and j that are weakly related. Examples of the considerations include maximum frequency Fmax of an integrated circuit generated based on a design hierarchy including nodes i and j, area of the integrated circuit, timing constraint of a path, which may be a critical path, of the integrated circuit, and power consumed by the integrated circuit. For example, although nodes i and j are weakly related, clustering or not partitioning the nodes results in improving a maximum frequency Fmax of an integrated circuit compared to a maximum frequency of the integrated circuit in which the nodes are partitioned or not clustered or clustering or not partitioning the nodes reduces an area occupied by blocks representing the nodes on the integrated circuit compared to an area occupied by blocks representing the nodes that are partitioned or not clustered. If clustering or partitioning of a node affects the set of considerations, the node is a critical node. Upon determining that the set of considerations are affected, processing unit 120 clusters or does not partition 1304 the nodes and j. On the other hand, upon determining that the set of considerations are not affected, processing unit 120 partitions or does not cluster 1308 the nodes i and j.

Figure 15:
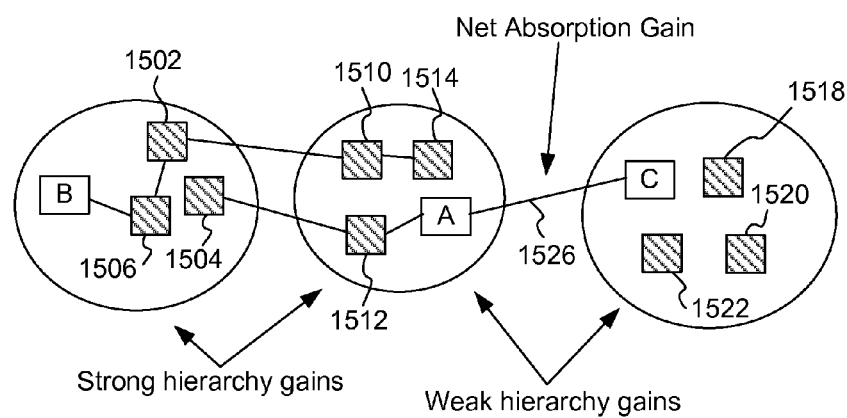
FIG. 15 is a block diagram of an example of a representation of a design hierarchy tree to which the technique may be applied.

An illustration of not clustering or partitioning and of clustering or not partitioning is provided in FIG. 15. Processing unit 120 clusters logic elements 1502, 1504, and 1506 together, clusters logic elements 1510, 1512, and 1514 together, and clusters logic elements 1518, 1520, and 1522 together. Logic elements A, B, and C are candidates remaining to be clustered. Each logic element 1502, 1504, 1506, 1510, 1512, 1514, 1518, 1520, 1522, A, B, and C is an example of logic element 302 (FIG. 3).

Processing unit 120 compares a gain of absorbing a net 1526 between logic elements A and C with the performance threshold β and a gain between logic elements A and B with the performance threshold β. If processing unit 120 determines that the gain of absorbing the net between logic elements A and C is less than or equal the number of the performance threshold β and partitioning or not clustering logic element A with logic element C does not affect the considerations, processing unit 120 determines not to cluster logic element A with logic element C. If processing unit 120 determines that the gain between the logic elements A and B is greater than the performance threshold β, processing unit 120 clusters logic element A with logic element B.

It is noted that clustering of the nodes i and j results in elimination of nets between the nodes i and j and results in merging of the nodes i and j within the cluster and also results in pruning of a design hierarchy tree that includes the nodes i and j. Moreover, partitioning, such as pruning, of the node i from the cluster including the node j results in an extension of a design hierarchy tree including the nodes i and j and an increase of one or more nets between the nodes i and j.

Referring back to FIG. 13, processing unit 120 determines 1310 whether a set of nodes within the cluster appropriate. For example, processing unit 120 determines whether the cluster created by clustering 1304 includes more than a pre-determined number of nodes. The pre-determined number of nodes is provided by the user via input device 126. The pre-determined number is an integer, such as, three, ten, or twenty.

Upon determining that the cluster created by clustering 1304 includes more than the pre-determined number of nodes, processing unit 120 partitions 1312 a number of nodes from the cluster to achieve the pre-determined number of nodes. For example, if node A is strongly related to node B and node B is strongly related to node C, processing unit 120 clusters nodes A, B, and C together within the cluster. In this example, upon determining that the pre-determined number of nodes is two, processing unit 120 does not cluster C in the cluster including nodes A and B. Processing unit 120 may cluster the partitioned node such as node C with a cluster with no nodes or a cluster with a node strongly related to the partitioned node. On the other hand, upon determining that the cluster includes less than or equal to the pre-determined number of nodes, processing unit 120 does not partition 1314 the number of nodes from the cluster to achieve the pre-determined number of nodes in the cluster.

In an alternative embodiment, processing unit 120 determines that nodes i and j are strongly related if a gain between the nodes i and j from the standpoint of node i is greater than the percentage threshold β and a gain between nodes j and i from the standpoint of node j is greater than the percentage threshold β. In another alternative embodiment, processing unit 120 determines that nodes i and j are weakly related if a gain between nodes i and j from the standpoint of node i is less than or equal to the percentage threshold β or a gain between nodes j and i from the standpoint of node j is less than or equal to the percentage threshold β.

In an alternative embodiment, processing unit 120 partitions or does not cluster the nodes i and j upon determining that the nodes are weakly related. For example, processing unit 120 does not execute task 1306.

In various embodiments, processing unit 120 determines whether clustering or not partitioning 1304 nodes i and j results in exceeding a certain percentage limit, provided by the user via input device 126, of a total number of nodes, of a design hierarchy tree, to which node is strongly related. This certain percentage limit maybe 25% or 30% of the total number of nodes of the design hierarchy tree. Upon determining that the clustering or not partitioning 1304 results in exceeding the certain percentage limit, processing unit 120 partitions or does not cluster the nodes i and j. On the other hand, upon determining that the clustering or not partitioning 1304 of nodes i and j results in matching or not exceeding the certain percentage limit, processing unit 120 clusters the nodes i and j.

In yet another alternative embodiment, processing unit 120 determines whether application of the percentage threshold β results in a portion of a large number of nodes of a design hierarchy tree to be clustered with or not partitioned from the node i. The large number, such as 20 or 40, and the portion are provided by the user via input device 126. Upon determining that the application of the percentage threshold β results in the portion to be clustered with or not partitioned from the node i, processing unit 120 changes the percentage threshold β so that the large number of nodes are clustered with or not partitioned from the node i. On the other hand, upon determining that the application of the percentage threshold β does not result in the portion to be partitioned from or not clustered with the node i, processing unit 120 does not change the percentage threshold β. For example, consider a gain list, which is an exemplary gain matrix, that includes two nodes having gains of 40 each and twenty nodes having gains of one each. Application of the percentage threshold β results in clustering or not partitioning fifteen of the nodes having gain of one each with the two nodes having a gain of forty each. Given that the nodes having gain of one are close in size with respect to each other, processing unit 120 determines to move the percentage threshold β to either include or exclude all the twenty nodes having gain of one each to be clustered with or not partitioned from the two nodes having gains of 40 each.

In still another alternative embodiment, upon determining that the percentage threshold 13 results in the portion to be clustered with or not partitioned from the node i, processing unit 120 changes the percentage threshold β so that the large number is partitioned from or not clustered with the node i.

In various embodiments, instead of or in addition to making determination 1306 regarding the considerations, processing unit 120 partitions from the cluster any node not directly related to the node i of the cluster. A first node is directly related to a second node if the first node is related to the second node and there is no intermediate node between the first and second nodes. For example, if node A is strongly related to node B and node B is strongly related to node C, node A is directly related to node B and node B is directly related to node C. However, node A is not directly related to node C. So, processing unit 120 partitions node C from the cluster. Processing unit 120 does not partition from the cluster any node directly related to the node i. Processing unit 120 clusters the partitioned node, such as node C, in a cluster with no nodes or a cluster with a node directly related to the partitioned node.

In other various embodiments, processing unit 120 uses a history of previous optimizations achieved during a first iteration of the technique 500 to reduce a number of nodes to which a second iteration of one or more tasks of technique 500 is applied. For example, if during the first iteration of technique 500, weakly related nodes i and j are clustered or not partitioned to create the cluster because partitioning or not clustering the nodes affects the considerations, processing unit 120, during the second iteration of technique 500, does not determine whether a weak or strong relation exists between the nodes i and j.

Figure 16:
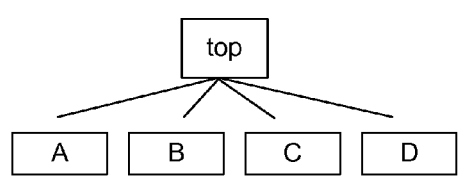
FIG. 16 is a block diagram of an embodiment of a design hierarchy tree used to illustrate the technique.
Figure 17:
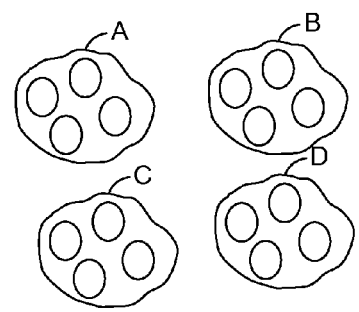
FIG. 17 shows an embodiment of multiple nodes of the design hierarchy tree of FIG. 16.
Figure 18:
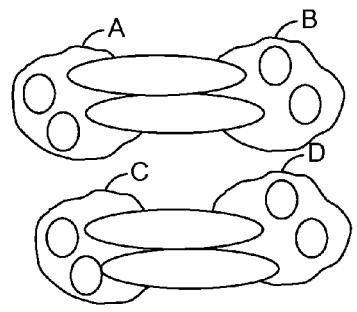
FIG. 18 shows an embodiment of the nodes to illustrate an advantage of using historical data generated by the technique.
Figure 19:
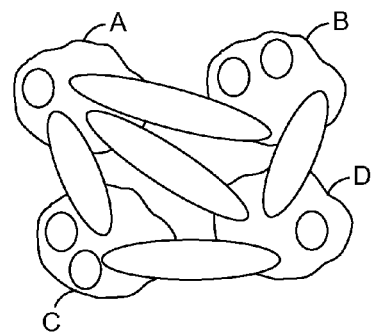
FIG. 19 shows another embodiment of the nodes to illustrate a disadvantage of not using the historical data.

As another example, an embodiment of a design hierarchy tree including multiple nodes A, B, C, and D is shown in FIG. 16 and the same nodes are shown in FIG. 17. During the first iteration of technique 500, processing unit 120 determines that the hierarchical nodes A, B, C, and D are unrelated, and clusters node A with node B and node C with node D as shown in FIG. 18 to meet area requirements of an area of an integrated circuit having blocks corresponding to the nodes A, B, C, and D. The area requirements are provided by the user via input device 126. In this example, during the second iteration, processing unit 120 determines not to determine whether nodes A, B, C, and D are weakly or strongly related but determines to use the clustering established during the first iteration and such clustering makes application of place and route phase 410 (FIG. 4) easy. If during the second iteration, processing unit 120 determines that nodes A, B, C, and D are weakly related without further applying the considerations, processing unit 120 may cluster node A with node B, node A with node D, node A with node C, node B with node C, node B with node D, and node C with node D, as shown in FIG. 19. However, such clustering during the second iteration does not meet the area requirements and makes application of place and route phase 410 difficult.

As yet another example, during the second iteration of technique 500, processing unit 120 determines whether the considerations affected partitioning or not clustering nodes i and j during the first iteration of technique 500. Upon determining that the considerations affected the partitioning or not clustering during the first iteration, processing unit 120 does not determine whether the nodes i and j are strongly or weakly related during the second iteration. On the other hand, upon determining that the considerations did not affect the partitioning or not clustering during the first iteration, processing unit 120 determines, during the second iteration, whether the nodes i and j are weakly or strongly related during the second iteration.

In various embodiments, as the process of optimization across weakly related nodes continues, it may be useful to perform the previous gain calculations. Once weakly related nodes have been merged, this may change the decision of which nodes should be considered weakly related and which ones should not be considered weakly related. How often the recalculations are performed depends on how much runtime processing unit 120 can afford. In these embodiments, processing unit 120 determines whether a runtime, provided by the user via input device 126 is exceeded. The runtime is an amount of time taken to execute technique 400. Upon determining that the runtime is not exceeded, processing unit 120 determines to apply a further iteration, such as the second iteration or a third iteration, of technique 500. On the other hand, upon determining that the runtime is exceeded, processing unit 120 determines not apply the further iteration of technique 500.

Figure 20:
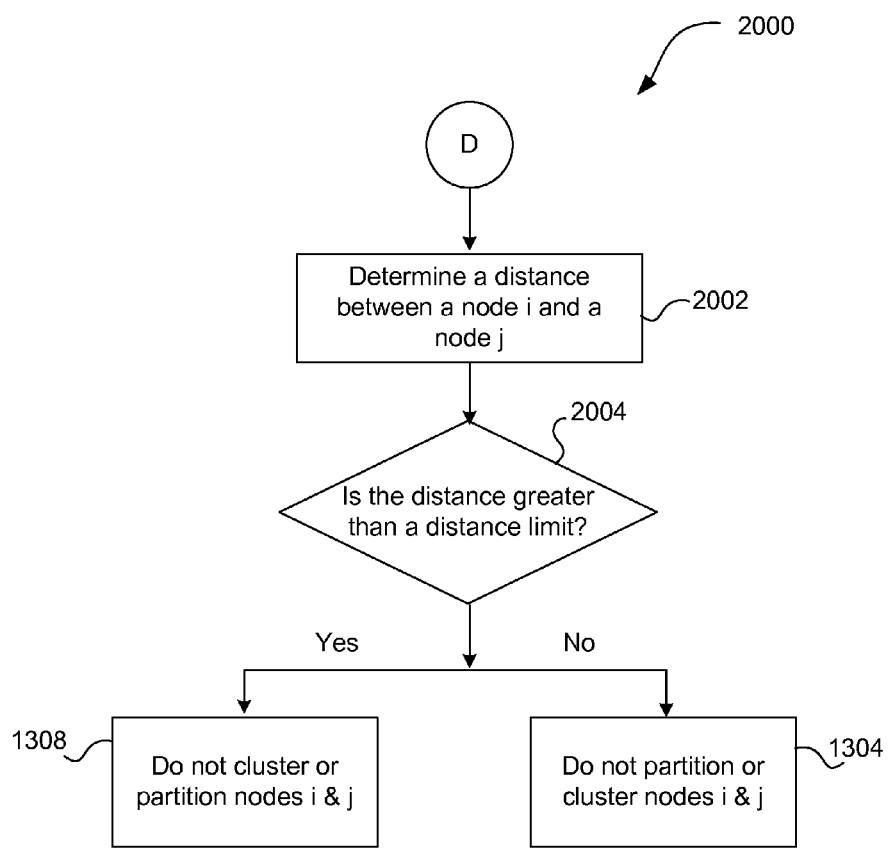
FIG. 20 is a flowchart of another embodiment of a technique for optimizing placement and routing.

FIG. 20 is a flowchart of another embodiment of a technique 2000 for optimizing placement and routing. Processing unit 120 determines 2002 a distance λ between the nodes i and j of a design hierarchy tree. As an example, if the nodes i and j are directly connected without any intermediate nodes between the nodes i and j, the distance λ between the nodes i and j is one. In this example, the node i is a parent node and the node j is a child node. The parent node i is at a distance of one away from the child node j and the child node j is at a distance of one away from the parent node i. As another example, if the nodes i and j are not directly connected and have an intermediate node between the nodes i and j, the distance λ between the two nodes i and j is two. As yet another example, processing unit 120 rates the distance λ between the two nodes i and j as being inversely proportional to a size of intermediate nodes between the two nodes i and j. In this example, processing unit 120 determines the distance λ between the two nodes i and j as a function of a size of an intermediate node between the nodes i and j. The intermediate node is a child of the parent node i and the node j is a child of the parent intermediate node. In this example, if the intermediate node has a first amount of logic, such as a first number of logic gates, a first distance exists between the nodes i and j and if the intermediate node has a second amount of logic, such as a second number of logic gates greater than the first number of logic gates, a second distance exists between the nodes i and j. Further, in this example, processing unit 120 determines that the second distance is greater than the first distance. As yet another example, processing unit 120 determines the distance λ between the two nodes i and j as a function of a number of intermediate nodes between the nodes i and j and an amount of logic within each of the intermediate nodes. As another example, if the nodes i and j are not directly connected and have an intermediate node between the two nodes i and j, the distance λ between the two nodes i and j is two.

Processing unit 120 determines 2004 whether the distance λ between the nodes i and j is greater than a distance limit γ provided by the user via input device 126. Upon determining that the distance λ is greater than the distance limit γ, processing unit 120 partitions or does not cluster 1308 the nodes i and j. On the other hand, upon determining that that the distance λ is less than or equal to the distance limit γ, processing unit 120 clusters or does not partition 1304 the nodes i and j. Thus, processing unit 120 may cluster or does not partition two weakly related nodes that contain the least amount of logic between them.

In an alternative embodiment, upon determining the distance λ between the nodes i and j, processing unit 120 places the nodes i and j and any intermediate nodes between the two nodes i and j on blocks of a target device, which is a block, of an integrated circuit, measures a time delay of a signal traversing the target device, and determines whether the time delay violates, such as exceeds, a timing constraint, provided by the user via input device 126, of a path of the integrated circuit. The path passes via the blocks on which node i, the intermediate nodes, and node j are placed. Upon determining that the placement on the target device violates the timing constraint, processing unit 120 partitions or does not cluster the nodes i and j. On the other hand, upon determining that the placement does not violate the timing constraint, processing unit 120 clusters or does not partition the nodes i and j.

In another alternative embodiment, upon determining that the placement on the target device violates the timing constraint, processing unit 120 duplicates node j and/or node i during synthesis phase 404 (FIG. 4). This early duplication during synthesis phase 404 can help processing unit 120 to find better solution during place and route phase 410.

Figure 21:
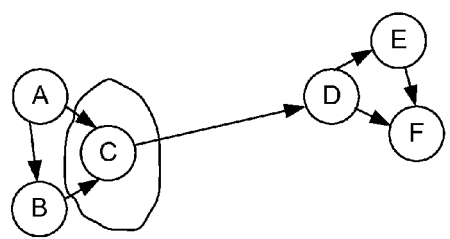
FIG. 21 is a diagram illustrating an embodiment of multiple logic elements of a netlist created by synthesis and illustrating connectivity between the elements.
Figure 22:
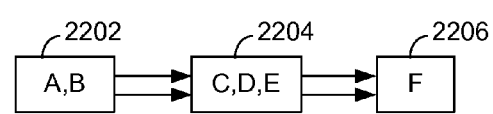
FIG. 22 is a diagram illustrating clustering achieved without applying the technique.
Figure 23:
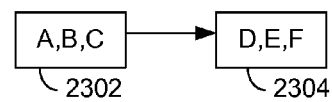
FIG. 23 is a diagram illustrating clustering achieved by applying the technique.

FIG. 21 is a diagram illustrating an embodiment of multiple logic gates A, B, C, D, E, and F and natural connectivity between the logic gates. Suppose logic gate C is situated in a cluster with a capacity of three logic gates. Looking at local connectivity, such as connectivity only around the logic gate C, it would seem that logic gate A, B and D are all equally good logic gates to cluster with logic gate C. By using the local connectivity, three clusters 2202, 2204, and 2206 are generated as shown in FIG. 22. However, by applying the systems and techniques, described herein, for optimizing placement and routing, two clusters 2302 and 2304 are generated as shown in FIG. 23. It is evident from FIG. 22 that clustering logic gate D with logic gate C results in a suboptimal placement and routing solution and it is evident from FIG. 23 that clustering logic gate D with logic gates A or B results in a lesser number of clusters, which are placed, during place and route phase 410 (FIG. 4), onto a block and a lesser number of nets than those shown in FIG. 22. The lesser number of nets eventually convert, during the place and route phase 410, into routing wires between the blocks. Moreover, each cluster is placed, during the place and route phase 410, on a block on the target device. Processing unit 120 executes clustering or partitioning phase 408 (FIG. 4) to minimize a number of nets between clusters and reduce a netlist to a more manageable size to provide the netlist to place and route phase 410.

It is noted that in various embodiments, the systems and techniques, described herein, for optimizing placement and routing are applied to unrelated nodes i and j instead of weakly related nodes i and j. It is also noted that although the flowcharts described herein execute tasks of a technique in a certain order, in various embodiment, the tasks can be executed in parallel or in a different order. It is further noted that in various embodiments, the systems and techniques described herein may be applied during the pre-synthesis phase between extract phase 402 (FIG. 4) and synthesis phase 404 (FIG. 4).

The exclusion aspect in which nodes i and j that are weakly related are partitioned from or not clustered with each other after taking or not taking into account the considerations provides good results. As an example, suppose two nodes are weakly related and have a single net between them. If a processing unit determines to absorb the single net, during a place and route phase, the processing unit may keep these two weakly related nodes close to each other when an optimal placement of one of the two nodes may be elsewhere on an integrated circuit. The techniques, described herein, use the nodes i and j that are be strongly related and represent strongly related entities. In a case in which the nodes i and j are not strongly related, such as weakly related, the techniques described herein may cluster the nodes i and j based on the considerations. Either way, the techniques are efficient because clustering nodes reduces a size of a design hierarchy tree substantially.

Systems and techniques, described herein, for optimizing placement and routing include improving efficiency of execution of place and route phase 410 by using natural connection of the nodes i and j in a design hierarchy tree.

Although the foregoing systems and techniques have been described in detail by way of illustration and example for purposes of clarity and understanding, it will be recognized that the above described systems and techniques may be embodied in numerous other specific variations and embodiments without departing from the spirit or essential characteristics of the systems and techniques. Certain changes and modifications may be practiced, and it is understood that the systems and techniques are not to be limited by the foregoing details, but rather is to be defined by the scope of the appended claims.

What is claimed is:

1. A method for optimizing placement and routing during an integrated circuit design process, comprising:
   using a design hierarchy tree having a global relationship representing an integrated circuit, wherein the design hierarchy tree includes a set of nodes, wherein each of the nodes has a defined set of inputs and outputs;
   representing a location of an atom in a design hierarchy of the integrated circuit as a location of one of the nodes in the design hierarchy tree;
   calculating, using a processor, a gain between two of the nodes; and
   performing synthesis, clustering, or partitioning of the nodes within the set based on the gain.

2. The method of claim 1, wherein said calculating the gain comprises computing the gain based on a fanout size of a net between the two nodes.

3. The method of claim 1, wherein said calculating the gain comprises computing the gain based on a sum of a plurality of fanout sizes of a plurality of nets between the two nodes.

4. The method of claim 1, wherein said calculating the gain comprises developing a matrix of a set of gains between the two nodes.

5. The method of claim 1, wherein said calculating the gain comprises developing a matrix of a set of gains including a first gain and a second gain between the two nodes, said method further comprising:
   determining whether each of the first and second gains is above a threshold;
   clustering or foregoing partitioning of the two nodes upon determining that the first or second gain is above the threshold; and
   partitioning or foregoing clustering of the two nodes upon determining that the first and second gains are not above the threshold.

6. The method of claim 5, further comprising:
   generating a cluster by said clustering the two nodes;
   determining whether a number of nodes other than the one of the two nodes in the cluster exceeds a percentage or constant limit of the nodes of the set of the design hierarchy tree;
   achieving the percentage by partitioning a node from the cluster upon determining that the number exceeds the percentage.

7. The method of claim 1, wherein said calculating the gain comprises developing a matrix of a set of gains including a first gain and a second gain between the two nodes, said method further comprising:

determining whether each of the first and second gains is above a threshold;
clustering the two nodes upon determining that the first and second gains are not above the threshold and one of the two nodes is a critical node.

8. The method of claim 1, wherein said calculating the gain comprises developing a matrix of a set of gains including a first gain and a second gain between the two nodes, said method further comprising:
determining whether each of the first and second gains is above a threshold;
generating a cluster by clustering the two nodes based upon the first or second gain; and
limiting a number of nodes within the cluster.

9. The method of claim 1, wherein said calculating the gain comprises developing a matrix of a set of gains including a first gain and a second gain between the two nodes, said method further comprising:
determining whether each of the first and second gains is above a threshold;
generating a cluster by clustering the two nodes based upon the first or second gain; and
allowing, in the cluster, only directly related nodes.

10. The method of claim 1, wherein said calculating the gain comprises developing a matrix of a set of gains including a first gain and a second gain between the two nodes, said method further comprising:
determining whether each of the first and second gains is above a threshold;
determining to partition the two nodes upon determining that the first and second gains are not above the threshold;
determining whether a consideration including an area, timing, a maximum frequency, or power of the integrated circuit is affected upon partitioning the two nodes; and
clustering the two nodes upon determining that the consideration is affected.

11. The method of claim 10, further comprising:
storing information that the two nodes are clustered as a result of the consideration; and
using the information during an iteration of the method.

12. The method of claim 1, wherein said calculating the gain comprises developing a matrix of a set of gains including a first gain and a second gain between the two nodes, said method further comprising:
determining whether each of the first and second gain is above a threshold;
determining whether a distance between the two nodes exceeds a distance limit; and
partitioning or foregoing clustering of the two nodes upon determining that each of the first and second gains are not above the threshold or the distance between the two nodes exceeds the distance limit.

13. The method of claim 12, wherein the distance is based on a number of links between the two nodes or a size of an intermediate node between the two nodes.

14. The method of claim 1, wherein said performing of clustering or partitioning comprises clustering or partitioning based on:
a size of an intermediate node between the two nodes; or
a timing constraint of the integrated circuit or an area restriction of the integrated circuit.

15. A non-transitory computer-readable medium encoded with computer-readable program code to be executed by a processor, for optimizing placement and routing during an integrated circuit design process, the program code comprising:
instructions for using a design hierarchy tree having a global relationship representing an integrated circuit, wherein the design hierarchy tree includes a set of nodes, wherein each of the nodes has a defined set of inputs and outputs;
instructions for representing a location of an atom in a design hierarchy of the integrated circuit as a location of the one of the nodes in the design hierarchy tree;
instructions for calculating, using a processor, a gain between two of the nodes; and
instructions for performing synthesis, clustering, or partitioning of the nodes within the set based on the gain.

16. The computer-readable medium of claim 15, wherein the instructions for calculating the gain comprise instructions for computing the gain based on a fanout size of a net between the two nodes.

17. The computer-readable medium of claim 15, wherein the instructions for calculating the gain comprise instructions for computing the gain based on a sum of a plurality of fanout sizes of a plurality of nets between the two nodes.

18. An integrated circuit comprising:
circuit elements, wherein the circuit elements are configured in part by an optimization of placement and routing during an integrated circuit design process, the optimization based on one or more locations of a set of nodes within a design hierarchy tree representing the integrated circuit,
wherein each of the set of nodes within the design hierarchy has a defined set of inputs and outputs,
wherein locations of a set of atoms in a design hierarchy of the integrated circuit are represented by the one or more locations of the set of nodes within the design hierarchy tree, and
wherein the set of nodes are configured to be clustered or partitioned based on a gain between two of the nodes.

19. The integrated circuit of claim 18, wherein the gain is calculated based on a fanout size of a net between the two nodes.

20. The integrated circuit of claim 18, wherein the gain is calculated based on a sum of a plurality of fanout sizes of a plurality of nets between the two nodes.

21. The integrated circuit of claim 18, wherein the set of nodes are clustered or partitioned based on:
a fanout size of a net between the two nodes;
a size of an intermediate node between the two nodes; or
a timing constraint of the integrated circuit or an area restriction of the integrated circuit.

* * * * *